United States Patent
Guo et al.

(10) Patent No.: US 7,990,731 B2
(45) Date of Patent: Aug. 2, 2011

(54) ELECTRONIC DEVICE

(75) Inventors: Shi-Kun Guo, Shenzhen (CN); Ke-Hui Peng, Shenzhen (CN); Guo-Ping Yao, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 304 days.

(21) Appl. No.: 12/344,460

(22) Filed: Dec. 27, 2008

(65) Prior Publication Data

US 2009/0207572 A1   Aug. 20, 2009

(30) Foreign Application Priority Data

Feb. 18, 2008   (CN) .................... 2008 1 0300354

(51) Int. Cl.
*H05K 5/00* (2006.01)

(52) U.S. Cl. ......... 361/753; 361/212; 174/382; 200/1 B; 200/5 A; 200/6 A; 200/294; 200/302.2; 200/305; 200/341; 200/517

(58) Field of Classification Search .................. 361/753, 361/212; 200/275, 276.1, 293, 341, 513, 200/517, 1 B, 5 A, 6 A, 294, 302.2, 305; 174/382
See application file for complete search history.

(56) References Cited

U.S. PATENT DOCUMENTS

| | | | | |
|---|---|---|---|---|
| 3,611,132 A * | 10/1971 | Wright et al. | ................. | 324/112 |
| 4,467,160 A * | 8/1984 | Murmann et al. | ............ | 200/536 |
| 4,476,355 A * | 10/1984 | Mital | ............................ | 200/5 A |
| 4,527,030 A * | 7/1985 | Oelsch | ........................... | 200/515 |
| 4,614,846 A * | 9/1986 | Guercio et al. | ............... | 200/5 E |
| 4,712,898 A * | 12/1987 | Haraguchi | ..................... | 396/539 |
| 4,733,036 A * | 3/1988 | Koizumi et al. | .............. | 200/517 |
| 4,786,766 A * | 11/1988 | Kobayashi | ..................... | 200/5 A |
| 4,794,215 A * | 12/1988 | Sawada et al. | ................ | 200/512 |
| 4,814,566 A * | 3/1989 | Sigl | ................................ | 200/305 |
| 4,927,990 A * | 5/1990 | Aoki et al. | ..................... | 200/517 |
| 4,987,278 A * | 1/1991 | Tsutsumi | ...................... | 200/294 |
| 5,172,805 A * | 12/1992 | Gumb | ............................ | 200/341 |
| 5,369,386 A * | 11/1994 | Alden et al. | .................. | 335/206 |
| 5,401,926 A | 3/1995 | Aoyama et al. | | |
| 5,579,900 A * | 12/1996 | Pryor et al. | .................... | 200/331 |
| 5,898,147 A * | 4/1999 | Domzalski et al. | ........... | 200/1 B |
| 5,952,634 A * | 9/1999 | Yoshida | ..................... | 200/302.2 |
| 6,046,572 A * | 4/2000 | Matthews et al. | ............. | 320/116 |
| 6,271,491 B1 * | 8/2001 | Ono et al. | ..................... | 200/520 |
| 6,593,909 B1 * | 7/2003 | Chou | ............................. | 345/157 |
| 6,621,024 B1 * | 9/2003 | Bello | ......................... | 200/302.2 |

(Continued)

FOREIGN PATENT DOCUMENTS

CN   2556713 Y   6/2003

(Continued)

*Primary Examiner* — Xiaoliang Chen

(74) *Attorney, Agent, or Firm* — Frank R. Niranjan

(57) ABSTRACT

An electronic device includes a housing defining a through hole, a circuit board fixed in the housing, including a switch and a grounding portion connecting with the ground, a fastening member received in the through hole fixed on the housing and contacting the grounding portion, passing static electricity therethrough and defining a mounting hole, and an actuating member received in the mounting hole and contacting the fastening member, and pressing the switch when actuated; wherein the fastening member and the actuating member are conductive.

20 Claims, 4 Drawing Sheets

U.S. PATENT DOCUMENTS

| | | |
|---|---|---|
| 6,621,446 B1 | 9/2003 | Chaillie |
| 6,635,832 B1* | 10/2003 | Oster et al. .................... 200/6 A |
| 6,677,843 B1* | 1/2004 | Monroe et al. ................. 335/205 |
| 6,705,783 B1* | 3/2004 | Bowen ........................... 400/472 |
| 6,809,274 B2* | 10/2004 | Takeuchi et al. .............. 200/6 A |
| 7,115,827 B2* | 10/2006 | Tseng ............................ 200/341 |
| 7,572,989 B2* | 8/2009 | Deshimaru ..................... 200/5 R |
| 7,652,216 B2* | 1/2010 | Sharrah et al. ................. 200/1 B |
| 7,662,111 B2* | 2/2010 | Cha et al. ...................... 600/583 |
| 2003/0033738 A1* | 2/2003 | Lii ................................. 40/364 |
| 2003/0076031 A1* | 4/2003 | Adams et al. ................. 313/493 |
| 2005/0189905 A1* | 9/2005 | Liang et al. ................... 320/107 |
| 2005/0237737 A1* | 10/2005 | Kim ............................... 362/197 |
| 2006/0231631 A1* | 10/2006 | Kawamata ................. 235/472.01 |
| 2007/0086273 A1* | 4/2007 | Polany et al. .................. 367/131 |
| 2007/0246335 A1* | 10/2007 | Sharrah et al. ................. 200/1 B |
| 2008/0020813 A1* | 1/2008 | Choi et al. .................... 455/575.3 |
| 2008/0035462 A1* | 2/2008 | Yanai et al. .................... 200/406 |
| 2009/0103250 A1* | 4/2009 | Takashima et al. ........ 361/679.02 |
| 2009/0159411 A1* | 6/2009 | Guo et al. ...................... 200/296 |
| 2009/0197461 A1* | 8/2009 | Benoit et al. .................. 439/535 |

FOREIGN PATENT DOCUMENTS

CN 200973123 Y 11/2007

* cited by examiner

ELECTRONIC DEVICE

BACKGROUND

1. Field of the Invention

The present invention generally relates to electronic devices, and particularly, to an electronic device with a protective input control module.

2. Description of Related Art

Electronic devices often utilize multiple input controls for receiving information. However, often, accumulated static electricity may be discharged between a user and input control at the point of contact, inflicting noise onto chips or circuits of the electronic device. Such noise can interfere with normal operations, and may damage the components.

As such, a need exists for an electronic device providing instantaneous and reliable discharge of static electricity from input controls.

DETAILED DESCRIPTION

Figure 1:
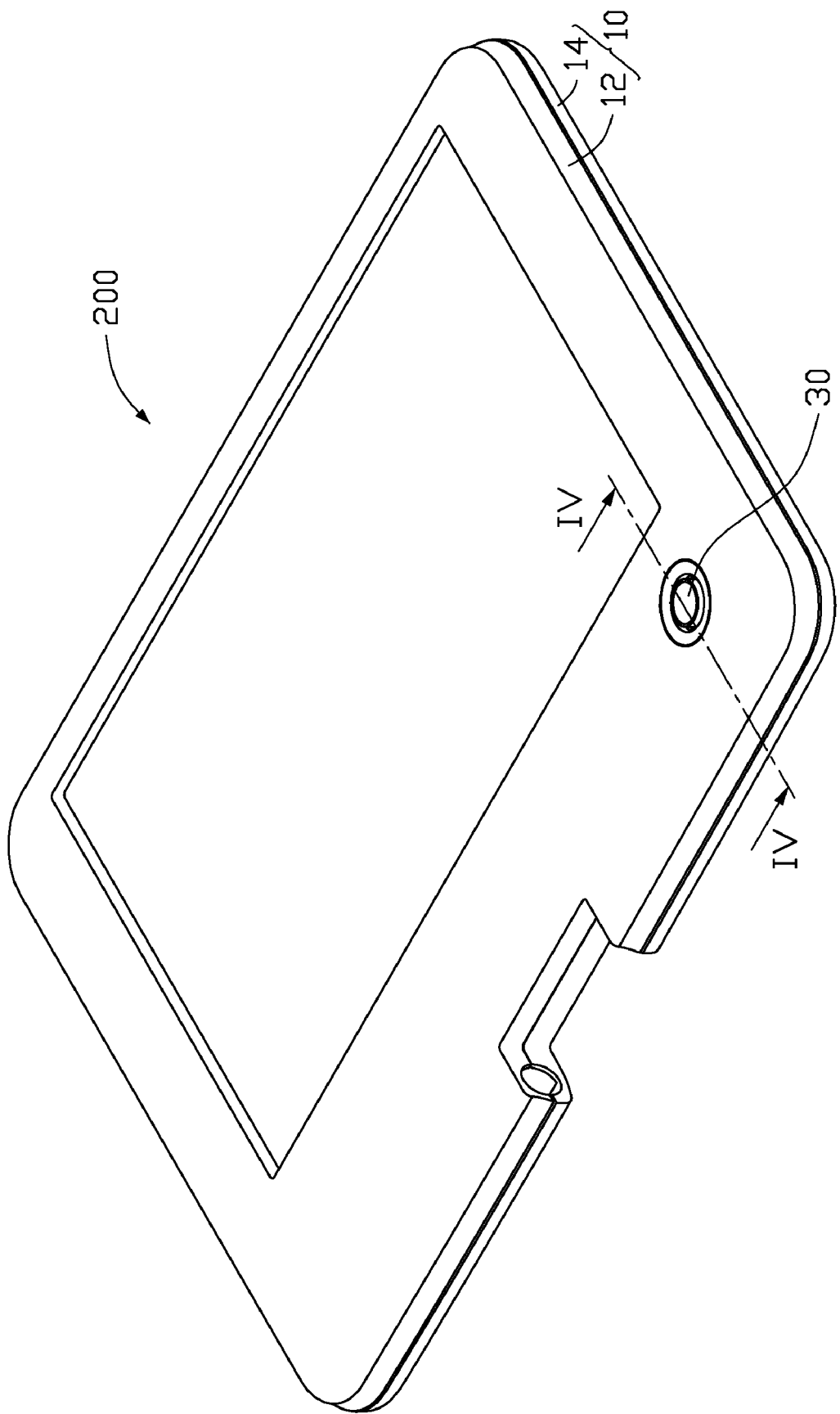
FIG. 1 is an isometric view of an electronic device in accordance with an exemplary embodiment.
Figure 2:
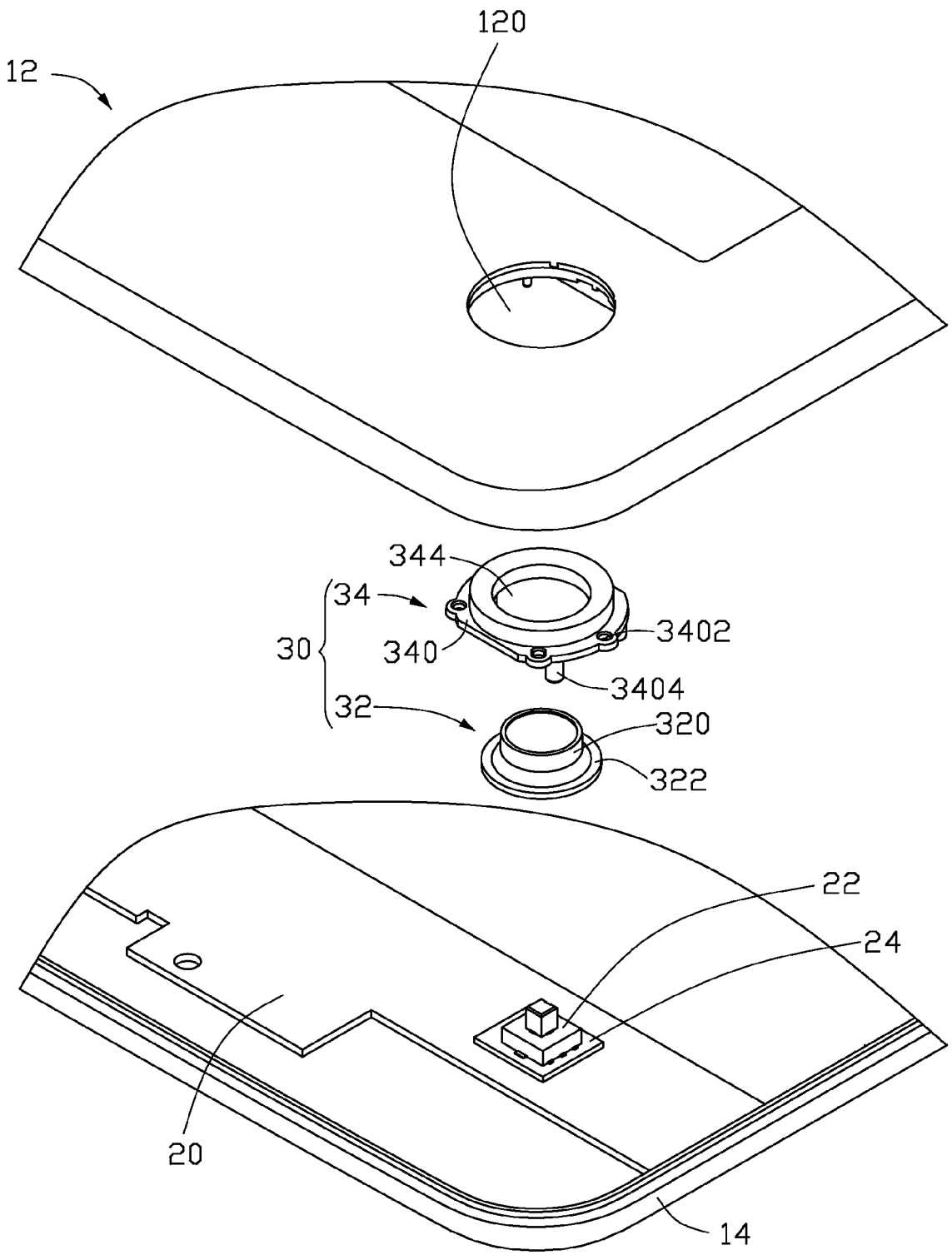
FIG. 2 is a partial exploded perspective view of the electronic device of FIG. 1.

Referring to FIGS. 1 and 2, an electronic device 200 in accordance with an exemplary embodiment includes a housing 10, a circuit board 20 received therein, and an input control module 30.

Figure 3:
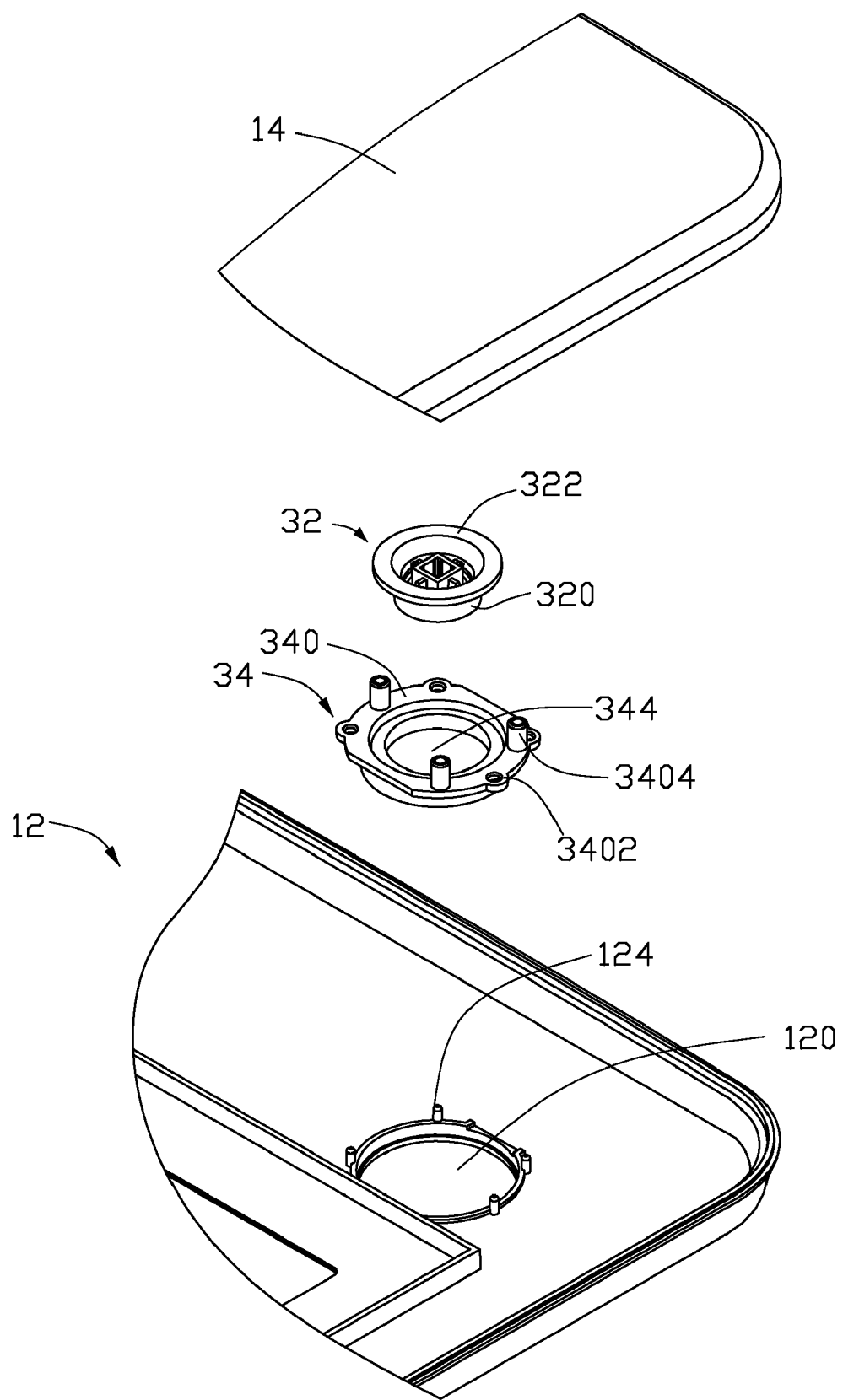
FIG. 3 is a partial exploded perspective view of the electronic device of FIG. 2 viewed from a reverse angle.
Figure 4:
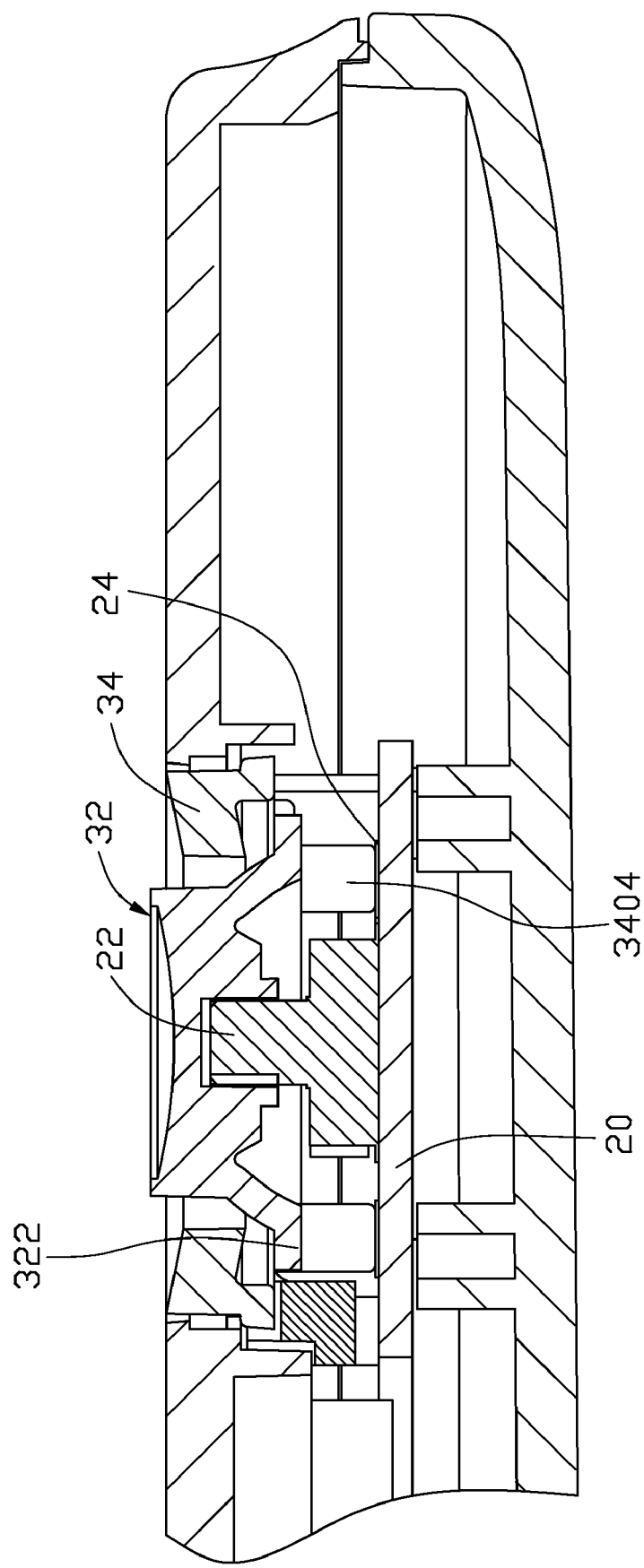
FIG. 4 is a cross-section of the electronic device of FIG. 1 along line IV-IV.

Further referring to FIGS. 3 and 4, the housing 10 includes an upper cover 12 and a lower cover 14 engaged therewith. A plurality of fixing portions 124 protrude from the upper cover 12. The fixing portions 124 face the lower cover 14. A circular through hole 120 is defined in the upper cover 12 among the fixing portions 124.

The circuit board 20 is fastened on the lower cover 14, and includes a switch 22 corresponding to the through hole 120 and a grounding portion 24 disposed near the switch 22 and connected to ground (not shown). The switch 22 controls electrical connection between two points (not shown) of the circuit board 20.

The input control module 30 is disposed in the through hole 120 of the upper cover 12. The input control module 30 includes an actuating member 32 and a fastening member 34. The actuating member 32 and the fastening member 34 are conductive components. In a preferred embodiment, the actuating member 32 and the fastening member 34 are plastic coated with conductive material, such as electroplating. Alternatively, the actuating member 32 and the fastening member 34 may be metal or any other conductive material.

The fastening member 34 is disposed in the through hole 120, and further defines a mounting hole 344 receiving the actuating member 32. A fastening portion 340 protrudes from the outside surface of the fastening member 34 to form a flange. The fastening portion 340 defines a plurality of fastening holes 3402 surrounding the mounting hole 344. The fastening holes 3402 correspond to the fixing portions 124 to accept passage therethrough of the fixing portions 124.

A discharge portion 3404 protrudes from the fastening member 34. The discharge portion 3404 is conductive, such that contact thereof with the grounding portion 24 passes static electricity thereto. In a preferred embodiment, the discharge portion 3404 includes three cylindrical projections disposed on the lower surface of the fastening member 34.

The actuating member 32 includes a cylindrical pressing portion 320, enabling the switch 22 to electrically connect two points of the circuit board 20 when actuated, and electrically disconnect the two points when released. The pressing portion 320 is disposed in the mounting hole 344 and sleeved by the fastening member 34. A limiting portion 322 protrudes from the outside surface of the pressing portion 320 between the fastening member 34 and the circuit board 20. The limiting portion 322, a flange, restricts extension of the actuating member 32.

In assembly, the circuit board 20 is fixed to the lower cover 14, and the switch 22 is fixed on the circuit board 20 centered on the grounding portion 24. Secondly, the pressing portion 320 of the actuating member 32 is disposed in the mounting hole 344 of the fastening member 34, and the discharge portion 3404 of the fastening member 34 contacts the grounding portion 24, such that limiting portion 322 is located between the fastening member 34 and the circuit board 20 to limit the actuating member 32, and the pressing portion 320 faces the switch 22. Finally, the fixing portion 124 of the upper cover 12 passes through the fastening hole 3402 of the fastening member 34 to fix the fastening member 34 on the upper cover 12, whereby the fastening member 24 is disposed in the through hole 120 to accept actuation by a user. Thus is formed a static electricity release circuit made up of the actuating member 32, the grounding portion 24, and the fastening member 34, situated between an electrically charged external object and ground.

Accordingly, upon contact with the actuating member 32, any accumulated static electricity is instantaneously conducted to ground via the formed static electricity release circuit.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device comprising:
    a housing defining a through hole;
    a circuit board fixed in the housing, comprising a switch and a grounding portion connected to ground;
    a fastening member received in the through hole and fixed to the housing, contacting the grounding portion to allow static electricity to flow through the fastening member, wherein the fastening member defines a mounting hole; and
    an actuating member received in the mounting hole and contacting the fastening member, pressing the switch when actuated;
    wherein the fastening member electrically contacts the actuating member.

2. The electronic device as claimed in claim 1, wherein the actuating member includes a limiting portion disposed between the fastening member and the circuit board.

3. The electronic device as claimed in claim 1, wherein the fastening member includes a fastening portion protruding from the outside surface thereof to form a flange, the fasting portion further defining a plurality of fastening holes surrounding the mounting hole for fastening the fastening member to the housing.

4. The electronic device as claimed in claim 3, wherein a fixing portion protrudes from the housing, defining a fastening hole therein allowing the fixing portion to pass therethrough.

5. The electronic device as claimed in claim 2, wherein the fastening member comprises a discharge portion contacting the grounding portion.

6. The electronic device as claimed in claim 5, wherein the discharge portion is a cylindrical projection and disposed on the lower surface of the fastening member.

7. The electronic device as claimed in claim 1, wherein the outside surfaces of the fastening member and the actuating member are coated with conductive material.

8. The electronic device as claimed in claim 1, wherein the fastening member and the actuating member are electroplated plastic.

9. The electronic device as claimed in claim 1, wherein the fastening member and the actuating member are conductive material.

10. An electronic device comprising:
a housing defining a through hole and receiving a circuit board;
a grounding portion connected to ground;
a fastening member received in the through hole, fixed to the housing and contacting the grounding portion to conduct static electricity thereto; and
an actuating member sleeved by the fastening member and contacting the circuit board when actuated;
wherein the fastening member electrically contacts the actuating member.

11. The electronic device as claimed in claim 10, wherein the fastening member comprises a discharge portion corresponding to and contacting the grounding portion.

12. The electronic device as claimed in claim 11, wherein the discharge portion comprises a cylindrical projection and is disposed on the lower surface of the fastening member.

13. The electronic device as claimed in claim 10, wherein a limiting portion is disposed on the outside surface of the actuating member and located between the fastening member and the circuit board to limit extension of the actuating member between the fastening member and the circuit board.

14. The electronic device as claimed in claim 10, wherein the outside surfaces of the fastening member and the actuating member are coated with conductive material.

15. The electronic device as claimed in claim 10, wherein the fastening member and the actuating member are electroplated plastic.

16. The electronic device as claimed in claim 10, wherein the fastening member and the actuating member are conductive material.

17. An electronic device comprising:
a housing securing a circuit board and defining a through hole;
an actuating member, a first part of which protrudes from the housing and a second part of which contacts the circuit board when pressed;
a grounding portion connected to ground; and
a fastening member received in the through hole, fixed to the housing and contacting the actuating member and the grounding portion before the actuating member is actuated;
wherein the actuating member electrically contacts the actuating member.

18. The electronic device as claimed in claim 17, wherein the outside surfaces of the fastening member and the actuating member are coated with conductive material.

19. The electronic device as claimed in claim 17, wherein the fastening member and the actuating member are electroplated plastic.

20. The electronic device as claimed in claim 17, wherein the fastening member and the actuating member are conductive material.

* * * * *